(12) United States Patent
Koshika et al.

(10) Patent No.: US 11,894,502 B2
(45) Date of Patent: Feb. 6, 2024

(54) METHOD OF MANUFACTURING SEMICONDUCTOR OPTICAL DEVICE AND INTERMEDIATE ARTICLE OF SEMICONDUCTOR OPTICAL DEVICE

(71) Applicant: DOWA Electronics Materials Co., Ltd., Tokyo (JP)

(72) Inventors: Yuta Koshika, Akita (JP); Yoshitaka Kadowaki, Akita (JP); Tetsuya Ikuta, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 13 days.

(21) Appl. No.: 17/042,911

(22) PCT Filed: Mar. 27, 2019

(86) PCT No.: PCT/JP2019/013454
§ 371 (c)(1),
(2) Date: Sep. 29, 2020

(87) PCT Pub. No.: WO2019/189514
PCT Pub. Date: Oct. 3, 2019

(65) Prior Publication Data
US 2021/0020814 A1      Jan. 21, 2021

(30) Foreign Application Priority Data

Mar. 30, 2018    (JP) ................................ 2018-069432
Mar. 26, 2019    (JP) ................................ 2019-059233

(51) Int. Cl.
*H01L 33/00*       (2010.01)
*H01L 33/60*       (2010.01)
*H01L 33/30*       (2010.01)

(52) U.S. Cl.
CPC .......... *H01L 33/60* (2013.01); *H01L 33/0066* (2013.01); *H01L 33/30* (2013.01); *H01L 2933/0058* (2013.01)

(58) Field of Classification Search
CPC . H01L 33/0093; H01L 33/0066; H01L 33/60; H01L 33/30; H01L 33/0062;
(Continued)

(56) References Cited

U.S. PATENT DOCUMENTS 6,222,868 B1    4/2001    Ouchi et al.
8,705,583 B2    4/2014    Matsuda
(Continued)

FOREIGN PATENT DOCUMENTS

JP      H02224404 A       9/1990
JP      H04249384    *    9/1992
(Continued)

OTHER PUBLICATIONS

Jun. 25, 2019, International Search Report issued in the International Patent Application No. PCT/JP2019/013454.
(Continued)

*Primary Examiner* — Savitri Mulpuri
(74) *Attorney, Agent, or Firm* — KENJA IP LAW PC

(57) ABSTRACT

A method of manufacturing a semiconductor optical device of this disclosure includes the steps of forming an etch stop layer on an InP growth substrate, the etch stop layer having a thickness of 100 nm or less; and forming a semiconductor laminate on the etch stop layer by stacking a plurality of InGaAsP-based III-V group compound semiconductor layers containing at least In and P. Further, an intermediate article of a semiconductor optical device of the present disclosure includes an InP growth substrate; an etch stop layer formed on the InP growth substrate, the etch stop layer having a thickness of 100 nm or less; and a semiconductor
(Continued)

laminate formed on the etch stop layer, including a plurality of InGaAsP-based III-V group compound semiconductor layers containing at least In and P stacked one another.

5 Claims, 10 Drawing Sheets

(58) Field of Classification Search
CPC ......... H01L 21/02543; H01L 21/02505; H01L 2933/058; H01L 21/02461; H01L 21/02463; H01L 21/02546; H01L 21/0262; H01L 21/02392
See application file for complete search history.

(56) References Cited

U.S. PATENT DOCUMENTS

| | | | |
|---|---|---|---|
| 11,205,739 B2* | 12/2021 | Yamamoto | H01L 33/40 |
| 2006/0186422 A1* | 8/2006 | Gaska | H01L 21/30621 |
| | | | 257/E29.253 |
| 2007/0258498 A1* | 11/2007 | Kawahara | B82Y 20/00 |
| | | | 372/46.01 |
| 2008/0283819 A1* | 11/2008 | Konno | H01L 33/0093 |
| | | | 257/13 |
| 2010/0265980 A1 | 10/2010 | Matsuda | |
| 2010/0329297 A1 | 12/2010 | Rumpler et al. | |
| 2013/0099277 A1* | 4/2013 | Speck | H01L 33/007 |
| | | | 257/101 |
| 2014/0010253 A1 | 1/2014 | Sysak et al. | |
| 2019/0207055 A1 | 7/2019 | Yamamoto et al. | |
| 2020/0227585 A1 | 7/2020 | Yamamoto et al. | |
| 2020/0381589 A1* | 12/2020 | Yamamoto | H01L 33/30 |

FOREIGN PATENT DOCUMENTS

| | | | |
|---|---|---|---|
| JP | H06224404 A | | 8/1994 |
| JP | H10173289 A | | 6/1998 |
| JP | H11168262 A | | 6/1999 |
| JP | 2000196189 A | | 7/2000 |
| JP | 2005340504 A | | 12/2005 |
| JP | 2008186902 A | | 8/2008 |
| JP | 2008283096 | * | 11/2008 |
| JP | 2010251609 A | | 11/2010 |
| JP | 2013016582 A | | 1/2013 |
| JP | 2014013844 A | | 1/2014 |
| JP | 2018006495 A | | 1/2018 |
| TW | 201712734 A | | 4/2017 |
| TW | 201802952 A | | 1/2018 |

OTHER PUBLICATIONS

Nov. 10, 2021, Office Action issued by the Korean Intellectual Property Office in the corresponding Korean Patent Application No. 10-2020-7027423.

Oct. 6, 2020, International Preliminary Report on Patentability issued in the International Patent Application No. PCT/JP2019/013454.

Sep. 11, 2020, Office Action issued by the Taiwan Intellectual Property Office in the corresponding Taiwanese Patent Application No. 108111198.

Feb. 3, 2023, Office Action issued by the German Patent and Trade Mark Office in the corresponding German Patent Application No. 112019001735.7.

* cited by examiner

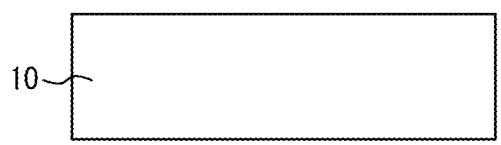
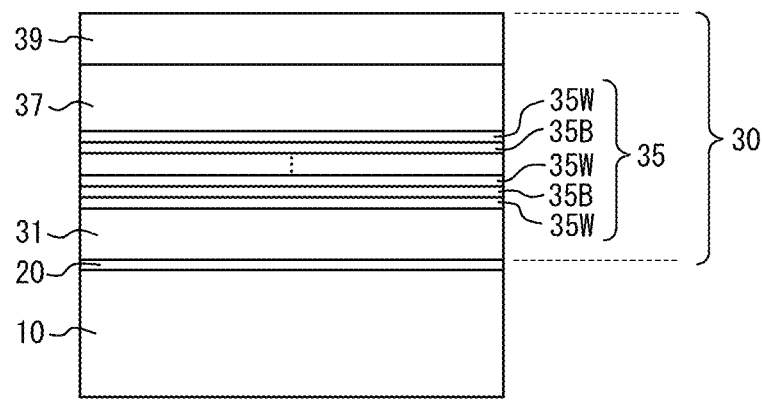
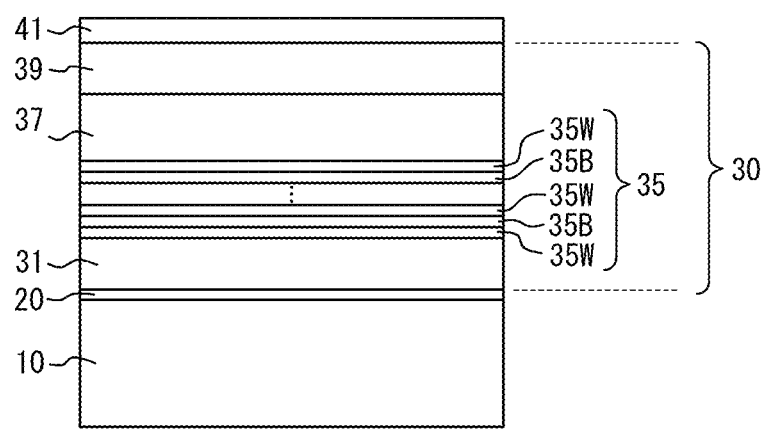

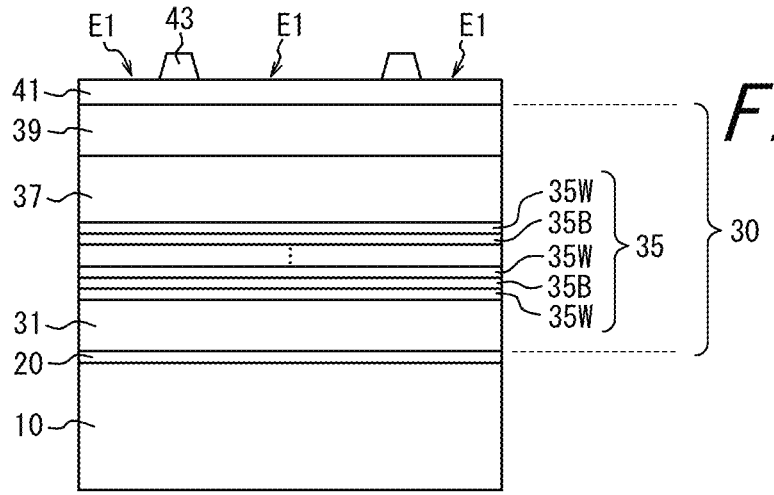
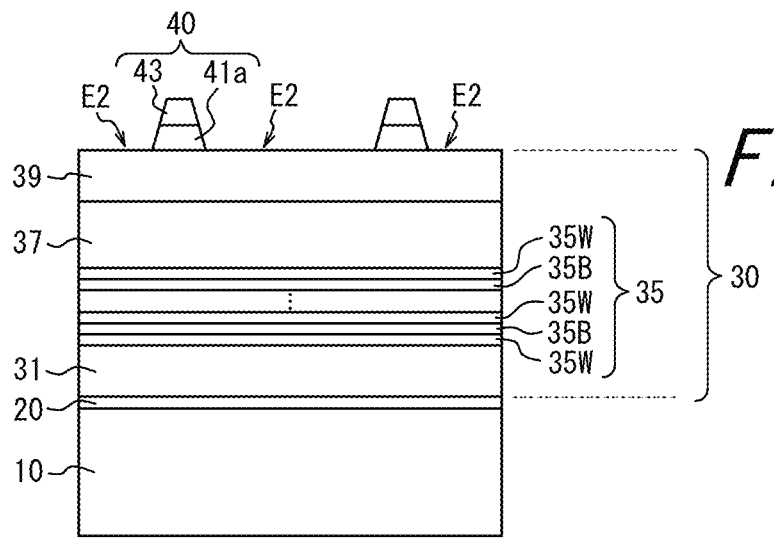
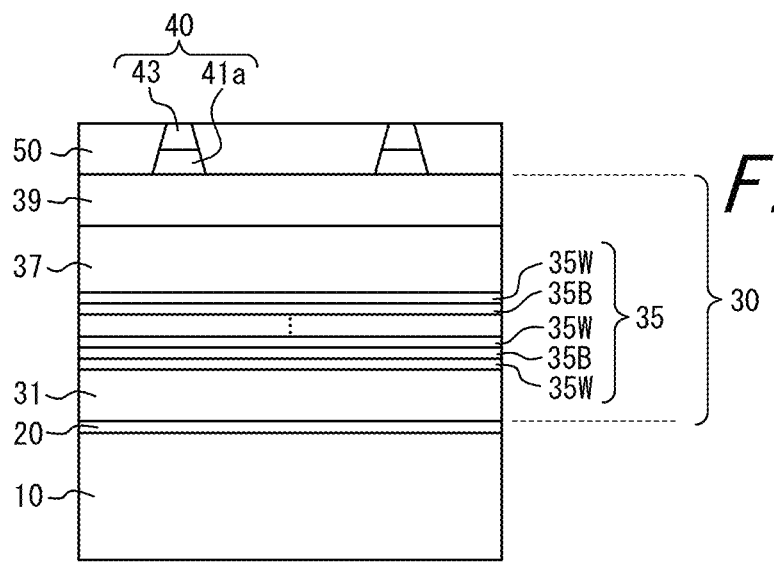

METHOD OF MANUFACTURING SEMICONDUCTOR OPTICAL DEVICE AND INTERMEDIATE ARTICLE OF SEMICONDUCTOR OPTICAL DEVICE

TECHNICAL FIELD

The present disclosure relates to a method of manufacturing a semiconductor optical device and an intermediate article of a semiconductor optical device.

BACKGROUND

In recent years, with increase in demand for wearable devices, there has been a demand for smaller semiconductor optical devices which receive or emit light in the infrared region. In particular, there is an increasing demand for semiconductor optical devices to have a smaller thickness (a smaller total thickness). Semiconductor optical devices having reception or emission wavelengths in the near-infrared region in wavelengths of 1000 nm to 2200 nm have attracted attentions as healthcare sensors, such as blood analysis sensors.

For addressing such a demand, we have proposed a first bonded semiconductor optical device which is manufactured through a step of forming a semiconductor laminate on an InP growth substrate; a step of bonding a support substrate made of a Si substrate having at least a metal bonding layer interposed therebetween, and a step of removing the InP growth substrate, for example (see PTL 1).

In such a method of manufacturing a semiconductor optical device where a support substrate is bonded and an InP growth substrate is removed, an etch stop layer is formed on the InP growth substrate prior to the bonding. The etch stop layer can be formed by growth (e.g., epitaxial growth) of a ternary or quaternary mixed crystal on the InP growth substrate, for example.

CITATION LIST

Patent Literature

PLT 1: JP 2018-006495 A

SUMMARY

Technical Problem

In the meantime, studies on an optimal etch stop layer in the step of removing an InP growth substrate had not been made thoroughly because no attempt had been made to remove the InP growth substrate prior to our proposal. In the step of removing an InP growth substrate, the InP growth substrate is immersed into an etching solution for a long time so that it is dissolved in the solution. The thickness of the substrate deviates across the plane of the substrate and the rate of the dissolution varies. Hence, in the course of dissolution of the InP growth substrate, there may be a case where a parts of the InP growth substrate are completely dissolved so that the etch stop layer is exposed to the etching solution, but the remainder of the substrate is not completely dissolved. In this case, the etch stop layer is required to remain without being completely dissolved until the substrate is completely dissolved. Accordingly, it was considered that the etch stop layer needs to be sufficiently thick. Nevertheless, it has been found that a cross-hatch may develop in a semiconductor laminate on an etch stop layer in a semiconductor optical device even when the lattice constant of the etch stop layer is made close to the lattice constant of InP. Here, the term "cross-hatch" refers to a defect that develops along the crystal lattice, which looks like lines in a lattice pattern on the surface of a semiconductor optical device. A cross-hatch impairs the appearance, and may also reduce the output power when a large current is fed.

Accordingly, the present disclosure is directed to provide a method of manufacturing a semiconductor optical device and an intermediate article of a semiconductor optical device, which can prevent a cross-hatch.

Solution to Problem

We have intensively studied on the cause of a cross-hatch. Our studies have led to the founding that provision of an etch stop layer induces accumulation of strain energy between the etch stop layer and an InP growth substrate, which causes a cross-hatch in an semiconductor optical device.

Specifically, we propose the following:

A method of manufacturing a semiconductor optical device of the present disclosure comprises the steps of:
  forming an etch stop layer on an InP growth substrate, the etch stop layer having a thickness of 100 nm or less; and
  forming a semiconductor laminate on the etch stop layer by stacking a plurality of InGaAsP-based III-V group compound semiconductor layers comprising at least In and P.

Preferably, in the method of manufacturing a semiconductor optical device of the present disclosure, the thickness of the etch stop layer is 50 nm or less.

Preferably, in the method of manufacturing a semiconductor optical device of the present disclosure, the thickness of the etch stop layer is 20 nm or less.

Preferably, in the method of manufacturing a semiconductor optical device of the present disclosure, the method further comprises the steps of:
  bonding a support substrate to the semiconductor laminate having at least a metal bonding layer interposed therebetween; and
  removing the InP growth substrate.

Preferably, in the method of manufacturing a semiconductor optical device of the present disclosure, a portion of the etch stop layer serves as an n-type InGaAs contact layer.

Preferably, in the method of manufacturing a semiconductor optical device of the present disclosure, the n-type InGaAs contact layer has a thickness of 1 nm to 100 nm.

Preferably, in the method of manufacturing a semiconductor optical device of the present disclosure,
  the semiconductor laminate comprises an n-type cladding layer, an active layer, and a p-type cladding layer, in this order, and
  the p-type cladding layer has a thickness of 1200 nm to 9000 nm.

Preferably, in the method of manufacturing a semiconductor optical device of the present disclosure, the thickness of the p-type cladding layer is 2400 nm to 9000 nm.

An intermediate article of a semiconductor optical device of the present disclosure comprises:
  an InP growth substrate;
  an etch stop layer formed on the InP growth substrate, the etch stop layer having a thickness of 100 nm or less; and
  a semiconductor laminate formed on the etch stop layer, the semiconductor laminate comprising a plurality of InGaAsP-based III-V group compound semiconductor layers comprising at least In and P stacked one another.

Preferably, in the intermediate article of a semiconductor optical device of the present disclosure, the thickness of the etch stop layer is 50 nm or less.

Preferably, in the intermediate article of a semiconductor optical device of the present disclosure, the thickness of the etch stop layer is 20 nm or less.

Preferably, in the intermediate article of a semiconductor optical device of the present disclosure, the semiconductor laminate comprises an n-type cladding layer, an active layer, and a p-type cladding layer, in this order, and
the p-type cladding layer has a thickness of 1200 nm to 9000 nm.

Preferably, in the intermediate article of a semiconductor optical device of the present disclosure, the thickness of the p-type cladding layer is 2400 nm to 9000 nm.

Preferably, in the intermediate article of the semiconductor optical device of the present disclosure, the intermediate article further comprises a support substrate bonded to the semiconductor laminate having at least a metal bonding layer interposed therebetween.

Advantageous Effect

According to the present disclosure, it is possible to provide a method of manufacturing a semiconductor optical device and an intermediate article of a semiconductor optical device, which can prevent a cross-hatch.

BRIEF DESCRIPTION OF THE DRAWINGS

In the accompanying drawings:

FIG. 1A is a schematic cross-sectional view depicting a flow of a method of manufacturing a semiconductor optical device according to an embodiment of the present disclosure;

FIG. 1B is a schematic cross-sectional view depicting the flow of the method of manufacturing a semiconductor optical device according to an embodiment of the present disclosure;

FIG. 1C is a schematic cross-sectional view depicting the flow of the method of manufacturing a semiconductor optical device according to an embodiment of the present disclosure;

FIG. 2A is a schematic cross-sectional view depicting the flow of the method of manufacturing a semiconductor optical device according to an embodiment of the present disclosure;

FIG. 2B is a schematic cross-sectional view depicting the flow of the method of manufacturing a semiconductor optical device according to an embodiment of the present disclosure;

FIG. 2C is a schematic cross-sectional view depicting the flow of the method of manufacturing a semiconductor optical device according to an embodiment of the present disclosure;

DETAILED DESCRIPTION

Figure 3A:
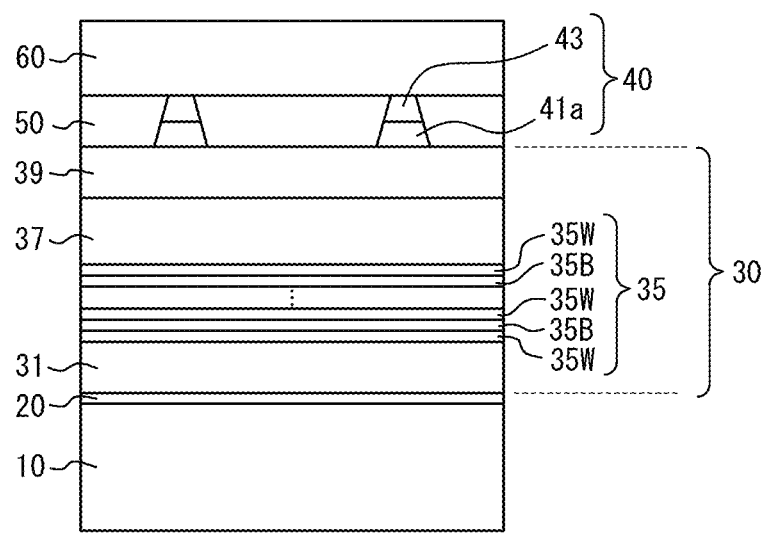
FIG. 3A is a schematic cross-sectional view depicting the flow of the method of manufacturing a semiconductor optical device according to an embodiment of the present disclosure.

Prior to describing embodiments of this disclosure, the following is described beforehand. First, in this specification, the expression "InGaAsP" alone for which the composition ratio is not specified means a given compound having a chemical composition ratio of group III elements (In and Ga in total) with respect to group V elements (As and P) of 1:1, in which the ratio between In and Ga that are group III elements and the ratio between As and P that are group V elements are undefined. In this case, there may be a possibility that one of In and Ga is not contained as the group III elements; or there may be a possibility that one of As and P is not contained as the group V elements. However, InGaAsP specified as "containing at least In and P" means that more than 0% and 100% or less of In is contained in the group III elements, and more than 0% and 100% or less of P is contained in the group V elements. Further, the expression "InGaP" means that As is not contained in the above-mentioned "InGaAsP" except for inevitable contamination in production, and the expression "InGaAs" means that P is not contained in the above-mentioned "InGaAsP" except for inevitable contamination in production. Similarly, the expression "InAsP" means that Ga is not contained in the above-mentioned "InGaAsP" except for inevitable contamination in production, and the expression "GaAsP" means that In is not contained in the above-mentioned "InGaAsP" except for inevitable contamination in production. Further, the expression "InP" means that Ga and As are not contained in the above-mentioned "InGaAsP" except for inevitable contamination in production. Note that the values of the composition ratios of InGaAsP, InGaAs, and the like can be measured for example by a photoluminescence measurement or an X-ray diffraction measurement. Further, as used herein, the term "inevitable contamination in production" refers to inevitable contamination originated from a manufacturing apparatus where source gases are used, as well as diffusions of atoms at interfaces between layers upon crystal growth or a subsequent heat treatment, and the like.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Zn, S, and Sn and does not serve as an electrically p-type or n-type layer is referred to as an "i-type" or "undoped" layer. An undoped InGaAsP layer may contain impurities that are inevitably mixed in the production process. Specifically, when the carrier density is low (for example, less than $4 \times 10^{16}/cm^3$), the layer is regarded as being "undoped" in this specification. Further, the values of the impurity concentrations of Zn, Sn, etc. are determined by SIMS analysis.

The total thickness of the layers formed can be measured using a thickness measurement system using optical interferometry. Moreover, the thickness of each layer can be calculated by observing a cross section of the growth layer using a thickness measurement system using optical interferometry and a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Embodiments of the present disclosure will now be exemplified and described with reference to the drawings. In principle, like components are denoted by the same reference numerals, and the description of those components will not be repeated. A substrate and layers in each drawing are exaggerated in width and thickness for convenience of description, so that the ratio between the vertical and horizontal dimensions of each illustrated component does not conform to the actual ratio.

Method of Manufacturing Semiconductor Light-Emitting Element

Referring to a case where a semiconductor optical device is a semiconductor light-emitting element, an embodiment of a method of manufacturing a semiconductor light-emitting element will be described.

First Step

In the method of manufacturing a semiconductor light-emitting element according to an embodiment of the present disclosure, as illustrated in FIG. 1A, an InP growth substrate 10 is first provided. The InP growth substrate 10 may use any one of n-type InP substrate, an undoped InP substrate, and a p-type InP substrate, which are commercially available. In this embodiment, the InP growth substrate 10 is an n-type InP substrate.

Subsequently, as illustrated in FIG. 1B, in the first step, an etch stop layer 20 is formed on the InP growth substrate 10. The etch stop layer 20 will serve to prevent a semiconductor laminate 30 from being removed during removal of the InP growth substrate 10 through etching in the later step. As used herein, the "etch stop layer" 20 refers to a layer having a etching selectivity such that the layer is resistant to etching in an etching solution for the InP growth substrate 10 (hydrochloric acid with a concentration of 0.1% to 36%) Further, it is preferable that an layer in a semiconductor laminate 30 which will come in contact with the etch stop layer (an n-type cladding layer 31 in this embodiment) has also etching selectivity such that the layer is resistant to etching in an etching solution for the etch stop layer. Further, the etch stop layer 20 is also lattice matched with the InP growth substrate 10 and with the semiconductor laminate 30 (an n-type cladding layer 31 in this embodiment) that will be directly formed on the etch stop layer 20 to the extent that the etch stop layer 20 can be grown on the InP growth substrate 10 and the semiconductor laminate 30 can be grown on the etch stop layer 20. Materials that can be lattice matched include InGaAs, as well as AlInAs, AlInGaAs, and InGaAsP. The etch stop layer that satisfies the above conditions may use an n-type InGaAs layer, in which case the content of In among group III elements is preferably 0.3 to 0.7, more preferably 0.47 to 0.6 so that the etch stop layer can be lattice matched with InP. When the composition formula of the etch stop etch stop layer 20 is expressed as $In_zGa_{(1-z)}As$ where z represents the In composition ratio, a crystal growth is ensured when the In composition ratio z is 0.47 or more and 0.60 or less, and the In composition ratio z is more preferably 0.50 or more 0.57 or less. Note that InGaAs is perfectly lattice matched with InP is when the In composition ratio z is 0.532. For exerting a compressive distortion on the semiconductor laminate 30, z satisfies preferably z>0.532, more preferably z≥0.54. Here, in this embodiment, the etch stop layer 20 has a thickness of 100 nm or less. In the present disclosure, the thickness of the etch stop layer 20 is preferably 50 nm or less, and more preferably 20 nm or less. On the other hand, the thickness of the etch stop layer 20 is preferably 1 nm or more, and more preferably 5 nm or more. The etch stop layer 20 may be a single layer, or may be a composite layer (e.g., an SLS layer) with another layer (in the latter case, the total thickness of the composite layer is 100 nm or less, preferably 50 nm or less, and more preferably 20 nm or less). The etch stop layer 20 can be formed by, for example, an epitaxial growth, and can be formed by a well-known thin film deposition technique, such as metalorganic chemical vapor deposition (MOCVD), molecular beam epitaxy (MBE), or sputtering, for example. For example, trimethylindium (TMIn) may be used as an In source, trimethylgallium (TMGa) as a Ga source, and arsine ($AsH_3$) as an As source at a predetermined mixing ratio, and these source gases may be subjected to vapor phase epitaxy using a carrier gas to form an InGaAs layer having a desired thickness (100 nm or less, preferably 50 nm or less, and more preferably 20 nm or less) by controlling the growth time.

In this embodiment, a portion of the etch stop layer 20 after removal of the InP growth substrate preferably serves as an n-type InGaAs contact layer 20. The n-type InGaAs contact layer 20 is a layer that is in direct contact with an n-type electrode. Further, the etch stop layer in the region other than the region where the etch stop layer will serve as the n-type InGaAs contact layer (the region where an n-type electrode is to be formed, or the region where an n-type electrode is to be formed and around the region) is preferably removed by etching.

Note that the n-type InGaAs contact layer 20 is not limited to a single layer having a constant composition, and may be composed of a plurality of layers having different In composition ratios z. In addition, the In composition ratio z of the n-type InGaAs contact layer 20 may have a gradient by increasing or decreasing the In composition ratio z in the thickness direction, for example. Further, the concentration of a dopant in the n-type InGaAs contact layer 20 may also be varied inside the layer.

Subsequently, as illustrated in FIG. 1B, in the first step, a semiconductor laminate 30 is formed on the etch stop layer 20, wherein the semiconductor laminate 30 includes a plurality of a InGaAsP-based III-V group compound semiconductor layers containing at least In and P stacked one another.

Here, preferably, the semiconductor laminate 30 includes an n-type cladding layer 31, an active layer 35, and a p-type cladding layer 37 in this order (from the etch stop layer 20 side in this embodiment), and the n-type cladding layer 31, the active layer 35, and the p-type cladding layer 37 are each formed of an InGaAsP-based III-V compound semiconductor containing at least In and P.

The semiconductor laminate 30 may have a double hetero (DH) structure in which the active layer 35 is sandwiched between the n-type cladding layer 31 and the p-type cladding layer 37, or a multiple quantum well (MQW) structure. With a view to improving the light output power by reducing crystal defects, the semiconductor laminate 30 more preferably has a multiple quantum well structure. A multiple quantum well structure can be formed by alternately repeatedly providing well layers 35W and barrier layers 35B. In this case, the well layers 35W may be of InGaAsP, and the barrier layers 35B are preferably of InGaAsP having a larger band gap than that of the well layers 35W. The semiconductor laminate 30 as described above allows the semiconductor light-emitting element 100 to emit light having a wavelength in a desired near-infrared region. For example, an emission peak wavelength of 1000 nm to 1650 nm can be achieved by varying the composition of the InGaAsP-based III-V compound. In the case of a MQW structure, an emission peak wavelength of 1000 nm to 1900 nm can be achieved by in addition to varying the composition of the InGaAsP-based compound, applying strain to the well layers by controlling the composition difference between the well layers and the barrier layers. As the n-type cladding layer 31, an n-type InP cladding layer is preferably used, and as the p-type cladding layer 37, a p-type InP cladding layer is preferably used. Further, when the chemical composition of the well layers 35W is expressed as $In_{xw}Ga_{1-xw}As_{yw}P_{1-yw}$, $0.5 \leq xw \leq 1$ and $0.5 \leq yw \leq 1$ can be satisfied, and $0.6 \leq xw \leq 0.8$ and $0.3 \leq yw \leq 1$ are preferably satisfied. When the chemical composition of the barrier layers 35B is expressed as $In_{xb}Ga_{1-xb}As_{yb}P_{1-yb}$, $0.5 \leq xb \leq 1$ and $0 \leq yb \leq 0.5$ can be satisfied, and $0.8 \leq xb \leq 1$ and $0 \leq yb \leq 0.2$ are preferably satisfied.

The total thickness of the semiconductor laminate 30 may be for example, but not limited to, 2 μm to 15 μm. Similarly, the thickness of the n-type cladding layer 31 may be for example, but not limited to, 1 μm to 5 μm. Further, the thickness of the active layer 35 may be for example, but not limited to, 100 nm to 1000 nm. Additionally, in the present disclosure, the thickness of the p-type cladding layer 37 may be for example, but not limited to, 1200 nm to 9000 nm, more preferably 2400 nm to 9000 nm. When the active layer 35 has a quantum well structure, the thickness of the well layers 35W may be 3 nm to 15 nm, and the thickness of the barrier layers 35B may be 5 nm to 15 nm. The number of pairs of both layers may be 3 to 50.

Further, as illustrated in FIG. 1B, the semiconductor laminate 30 preferably has a p-type cap layer 39 formed of InGaAsP containing at least In and P on the p-type cladding layer 37. The lattice mismatch can be reduced by providing the p-type cap layer 39. The thickness of the cap layer 39 may be for example, but not limited to, 50 nm to 200 nm. In this embodiment, the outermost surface layer of the semiconductor laminate 30 is the p-type cap layer 39; however, since the p-type cap layer 39 is an optional component in the present disclosure, the outermost surface layer of the semiconductor laminate 30 may be for example, the p-type cladding layer 37.

Although not illustrated, the semiconductor laminate 30 preferably has an i-type InP spacer layer each between the n-type cladding layer 31 and the active layer 35 and between the active layer 35 and the p-type cladding layer. The provision of the i-type InP spacer layers can hinder dopant diffusion. The thickness of the i-type InP spacer layers may be for example, but not limited to, 50 nm to 400 nm.

Here, the layers in the semiconductor laminate 30 can be formed by epitaxial growth, for example by a known thin film deposition technique such as metalorganic chemical vapor deposition (MOCVD), molecular beam epitaxy (MBE), or sputtering. For example, trimethylindium (TMIn) may be used as an In source, trimethylgallium (TMGa) as a Ga source, arsine ($AsH_3$) as an As source, and phosphine ($PH_3$) as a P source at a predetermined mixing ratio, and these source gases may be subjected to vapor phase epitaxy using a carrier gas to form an InGaAsP layer having a desired thickness by controlling the growth time. Note that other InGaAsP layers to be epitaxially grown may be formed in a similar manner. When the layers are p-type or n-type doped, a dopant source gas can be used in addition as desired.

Second Step

Subsequently, as illustrated in FIG. 1C, in the second step, a contact layer 41 made of a group III-V compound semiconductor is formed on the semiconductor laminate 30. For example, as illustrated in FIG. 1C, the p-type contact layer 41 can be formed on the p-type cap layer 39. The p-type contact layer 41 is a layer which will be in contact with a below-described ohmic metal portion 43, will be interposed between the ohmic metal portion 43 and the semiconductor laminate 30, and has a composition allowing for lower contact resistance with the ohmic metal portion 43 than with the semiconductor laminate 30. For example, the p-type contact layer 41 can be a p-type InGaAs layer. The thickness of the p-type contact layer 41 may be for example, but not limited to, 50 nm to 200 nm.

Third Step

Subsequently, as illustrated in FIG. 2A, in the third step, an ohmic metal portion 43 is formed on a part of the contact layer 41 leaving an exposed area E1 on a surface of the contact layer 41. The ohmic metal portion 43 can be formed into islands distributed in a predetermined pattern. When a p-type InGaAs layer is used as the p-type contact layer 41, for example, Au, AuZn, AuBe, AuTi, etc. can be used as the ohmic metal portion 43, and a structure in which those materials are stacked can preferably be used as the ohmic metal portion 43. For example, Au/AuZn/Au may be used as the ohmic metal portion 43. The thickness (or the total thickness) of the ohmic meal portion 43 may be for example, but not limited to 300 nm to 1300 nm, preferably 350 nm to 800 nm.

Here, for example, the third step can be performed by forming a resist pattern on a surface of the contact layer 41, vapor depositing the ohmic metal portion 43, and removing the resist pattern by lift-off to obtain the ohmic metal portion 43. Alternatively, the third step can be performed by forming a predetermined metal layer on the entire surface of the contact layer 41, forming a mask on the metal layer, and performing for example etching to form the ohmic metal portion 43. In either case, as illustrated in FIG. 2A, the ohmic metal portion 43 is formed on a part of the contact layer 41, and the surface of the contact layer 41 which is not in contact with the ohmic metal portion 43, i.e., the exposed area E1, is formed.

The shape of the ohmic metal portion 43 may be a trapezoidal shape in a cross-sectional view in some cases as illustrated in FIG. 2A by way of schematic illustration only. The ohmic metal portion 43 may be formed into a rectangular shape or may have rounded corners in a cross-sectional view.

Fourth Step

Subsequently, as illustrated in FIG. 2B, in the fourth step, the contact layer 41 of the exposed area E1 is removed so that a surface of the semiconductor laminate 30 is exposed, thereby forming a contact portion 40 composed of the ohmic metal portion 43 and the contact layer 41a and forming an exposed surface E2 of the semiconductor laminate 30. Specifically, the contact layer 41 of an area other than the areas of the ohmic metal portion 43 formed in the previous third step is etched to expose a surface of the p-type cap layer 39 which is the outermost surface layer of the semiconductor laminate 30, thereby obtaining the contact layer 41a. For example, a resist mask may be formed on and around (approximately 2 μm to 5 μm distant from) the ohmic metal portion 43, and the exposed area E1 of the contact layer 41 may be wet etched using a tartaric acid-hydrogen peroxide mixture. Alternatively, wet etching may be performed using an inorganic acid-hydrogen peroxide mixture, an organic acid-hydrogen peroxide mixture, etc. Further, when a mask is formed on a metal layer and etching is performed to form the ohmic metal portion 43 in the third step, the etching of the fourth step can be performed in continuity with the etching in the third step.

Note that the thickness of the contact portion 40 corresponds to the total thickness of the contact layer 41 (41a) and the ohmic metal portion 43 and may be 350 nm to 1500 nm, more preferably 400 nm to 1000 nm.

Fifth Step

Subsequently, as illustrated in FIG. 2C, in the fifth step, a dielectric layer 50 is formed on at least part of the exposed surface E2 of the semiconductor laminate 30. Such a dielectric layer 50 may be formed for example as follows.

First, a dielectric layer is deposited on the entire surface of the semiconductor laminate 30 so as to cover the semiconductor laminate 30 and the contact portion 40. For the film deposition, a known technique such as plasma CVD or sputtering can be used. When the dielectric layer 50 includes a dielectric formed above the contact portion 40 of the surface of the deposited dielectric layer, a mask may be formed as desired and the dielectric on the contact portion may be removed by etching etc. For example, the dielectric on the contact portion may be wet etched using buffered hydrofluoric acid (BHF) or the like.

Figure 5:
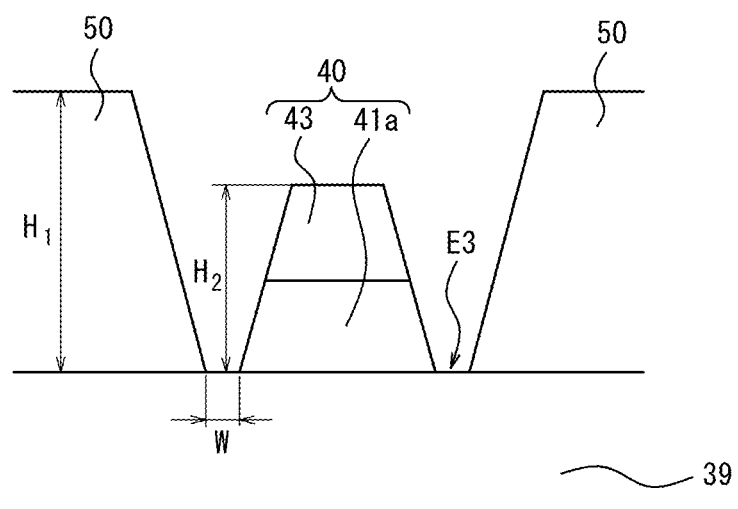
FIG. 5 is a schematic view depicting a vicinity of a dielectric layer and a contact portion in one intermediate article of a semiconductor optical device according to an embodiment of the present disclosure.

Further, as a variation, it is also preferred that the dielectric layer 50 is formed on part of the exposed surface E2 of the semiconductor laminate 30 leaving an exposed portion E3 around the contact portion 40, as illustrated in FIG. 5. The dielectric layer 50 and the exposed portion E3 described above may be formed for example as follows. First, a dielectric layer is deposited on the entire surface of the semiconductor laminate 30, and a window pattern completely surrounding the contact portion is formed using a resist above the contact portion 40 of the surface of the deposited dielectric layer. In this case, the window pattern is preferably larger than the contact portion by 1 μm to 5 μm, both in the width direction and the length direction. Using the thus formed resist pattern to remove the dielectric around the contact portion by etching, the dielectric layer 50 can be formed, and the exposed portion E3 is formed around the contact portion 40.

Provision of such an exposed portion E3 leads to formation of a heat dissipation path of the semiconductor light-emitting element 100. In order to ensure this effect, the width W of the exposed portion E3 (see FIG. 5) is preferably 0.5 μm or more and 5 μm or less, more preferably 1 μm or more and 3.5 μm or less.

Note that the ratio of the area of the dielectric layer 50 in contact with the semiconductor laminate 30 (contact area ratio) is preferably 80% or more 95% or less. When the area of the contact portion 41 is reduced and the area of the dielectric layer 50 is increased, absorption of light by the contact portion can be reduced. Note that the contact area ratio can be measured on a wafer, and when the contact area ratio is calculated backwards from the state of singulated semiconductor light-emitting elements, the calculation can be performed assuming that the width of the semiconductor layer at each end (a region where the electric layer has been present) removed by singulation is 20 μm to 30 μm (40 μm to 60 μm for both ends in total).

Note that in the fifth step, the relationship between the thickness $H_1$ of the dielectric layer 50 and the thickness $H_2$ of the contact portion 40 is not limited in particular; however, as illustrated in FIG. 5, when the thickness of the dielectric layer 50 is expressed as $H_1$ and the thickness of the contact portion is expressed as $H_2$, $H_1 \geq H_2$ can be satisfied, and $H_1 > H_2$ is preferably satisfied. Under these conditions, the thickness of the dielectric layer 50 may be for example, but not limited to 360 nm to 1600 nm, more preferably 410 nm to 1100 nm. Further, the difference between the thickness $H_1$ of the dielectric layer and the thickness $H_2$ of the contact portion 40: $H_1 - H_2$ is preferably 10 nm or more and 100 nm or less.

Moreover, the dielectric layer 50 may use $SiO_2$, SiN, ITO, AlN, or the like, and the dielectric layer 50 is preferably formed of $SiO_2$ in particular. $SiO_2$ can easily be treated by etching using BHF etc.

Sixth Step

Subsequently, as illustrated in FIG. 3A, in the sixth step, a reflective layer 60 for reflecting light emitted from the active layer 35 is formed on the dielectric layer 50 and the contact portion 40. The reflective layer 60 can employ a DBR, a reflective metal layer, a photonic crystal, refractive index differences induced by formation of partial void, or the like. Yet, for achieving readiness of fabrication and an adequate reflectivity to emitted light, the reflective metal layer 60 is preferably formed as a reflective metal layer. When the exposed portion E3 has been formed in the fifth step, the reflective metal layer 60 is formed also on the exposed portion E3. The reflective metal layer 60 "mainly containing Au" means that Au composes more than 50% by mass in the composition of the reflective metal layer 60, and preferably Au composes 80% by mass or more. The reflective metal layer 60 may include a plurality of metal layers;

however, when it includes a metal layer formed of Au (hereinafter "Au metal layer"), the thickness of the Au metal layer accounts for preferably more than 50% of the total thickness of the reflective metal layer 60. Other than Au; Al, Pt, Ti, Ag, etc. may be used as metals composing the reflective metal layer 60. For example, the reflective metal layer 60 may be constituted by a single layer formed of Au only; alternatively, the reflective metal layer 60 may include two or more Au metal layers. In order to ensure bonding in the subsequent seventh step, the outermost surface layer of the reflective metal layer 60 (the surface opposite to the semiconductor laminate 30) is preferably a Au metal layer. For example, metal layers of Al, Au, Pt, and Au may be formed in this order on the dielectric layer 50, the exposed portion E3, and the contact portion 40 to obtain the reflective metal layer 60. The thickness of one Au metal layer in the reflective metal layer 60 may be for example 400 nm to 2000 nm, and the thickness of each metal layer formed of a metal other than Au may be for example 5 nm to 200 nm. The reflective metal layer 60 can be formed on the dielectric layer 50, the exposed portion E3, and the contact portion 40 by a typical technique such as a vapor deposition process.

Seventh Step

Figure 3B:
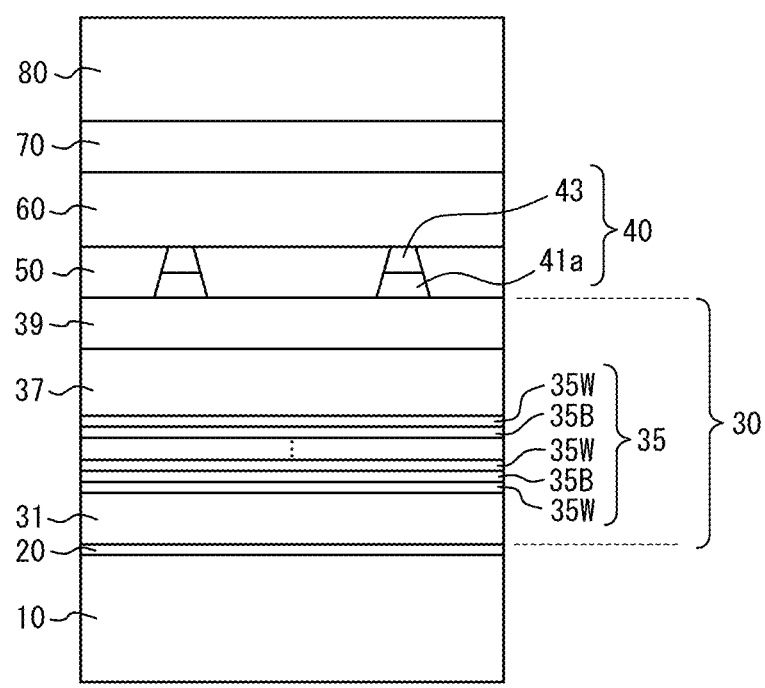
FIG. 3B is a schematic cross-sectional view depicting the flow of the method of manufacturing a semiconductor optical device according to an embodiment of the present disclosure.

Subsequently, as illustrated in FIG. 3B, in the seventh step, a conductive support substrate 80 having a surface provided with a metal bonding layer 70 is bonded to the reflective metal layer 60, having the metal bonding layer 70 interposed therebetween. On a surface of the conductive support substrate 80, the metal bonding layer 70 may be formed by sputtering, vapor deposition, etc. in advance. The metal bonding layer 70 and the reflective metal layer 60 are placed to face each other and put together, followed by bonding of the layers by thermocompression bonding at a temperature of approximately 250° C. to 500° C.

The metal bonding layer 70 bonded to the reflective metal layer 60 may be of metals such as Ti, Pt, and Au, or metals forming a eutectic alloy with gold (e.g., Sn), and is preferably formed from a laminate of those materials. For example, a laminate obtained by stacking Ti with a thickness of 400 nm to 800 nm, Pt with a thickness of 5 nm to 20 nm, and Au with a thickness of 700 nm to 1200 nm in this order on the surface of the conductive support substrate 80 can be used as the bonging layer 70. Note that in order to facilitate bonding between the reflective metal layer 60 and the metal bonding layer 70, a Au metal layer is provided as the outermost surface layer of the metal bonding layer 70, and Au is also provided as a metal layer of the reflective bonding layer 60 on the metal bonding layer 70 side to perform bonding between Au and Au by Au—Au diffusion bonding.

A conductive Si substrate may be used as the support substrate 80, for example, or a conductive GaAs or Ge substrate may also be used. In addition to the semiconductor substrate described above, a metal substrate may be used. Or a submount substrate employing a heat-dissipating insulative substrate made from sintered AlN or the like may also be used. The thickness of the support substrate 80 may be 100 μm or more and 500 μm or less, although it varies depending on the material used, and when a Si substrate or an GaAs substrate is used, a substrate with a thickness of less than 180 μm can be handled. A Si substrate is particularly preferable in terms of heat dissipation, brittleness, and cost.

Eighth Step

Figure 4A:
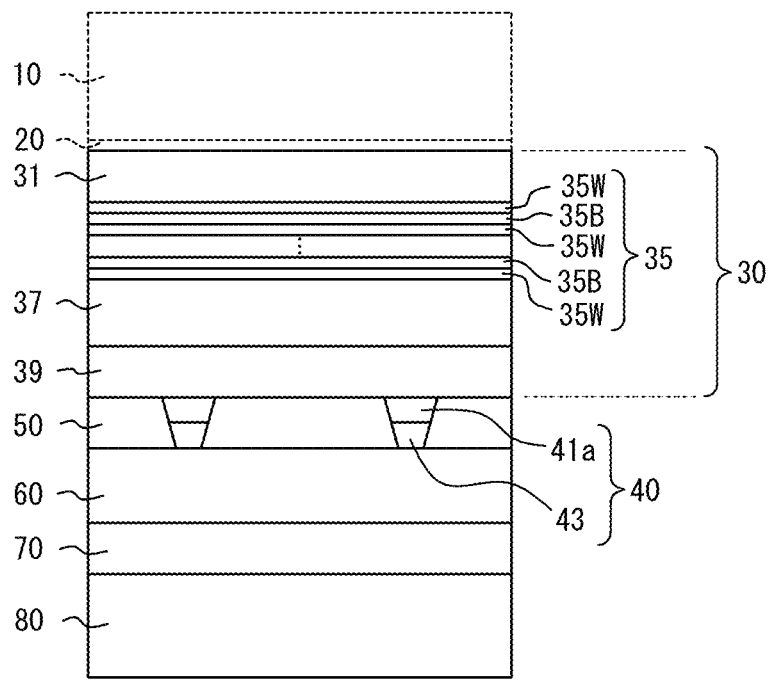
FIG. 4A is a schematic cross-sectional view depicting the flow of the method of manufacturing a semiconductor optical device according to an embodiment of the present disclosure.

Subsequently, as illustrated in FIG. 4A, in the eighth step, the InP growth substrate 10 is removed. The InP growth substrate 10 can be removed by wet etching for example using hydrochloric acid. In this embodiment, because the etch stop layer 20 is formed, etching can be stopped at this layer. Hydrochloric acid is preferably used in a concentration of 0.1% to 36%. In addition, the hydrochloric acid may be mixed with another chemical agent to the extent not to affect the selectivity of the etching. When the etch stop layer is an n-type InGaAs layer, the etch stop layer may be removed by wet etching for example using an etching solution containing a sulfuric acid-hydrogen peroxide mixture.

Ninth Step

Figure 4B:
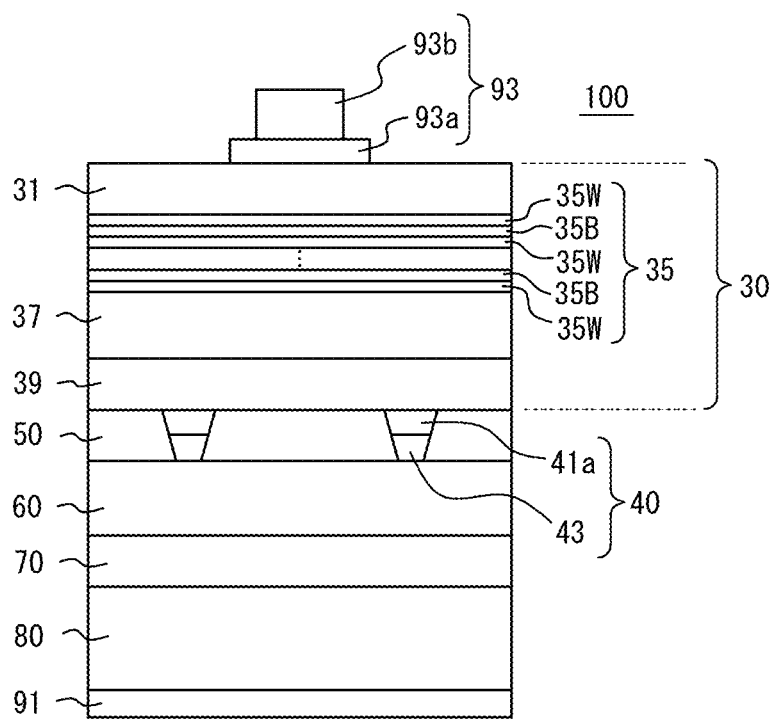
FIG. 4B is a schematic cross-sectional view depicting the flow of the method of manufacturing a semiconductor optical device according to an embodiment of the present disclosure.

Subsequently, as illustrated in FIG. 4B, the method includes a step of forming a back electrode 91 on the back surface of the conductive support substrate 80 and forming a top electrode 93 on the surface of the semiconductor laminate 30. The top electrode 93 may include a wiring portion 93a and a pad portion 93b. The back electrode 91 and the top electrode 93 can be formed by a known technique; for example, sputtering, electron-beam physical vapor deposition, resistance heating, etc. can be used.

Figure 9A:
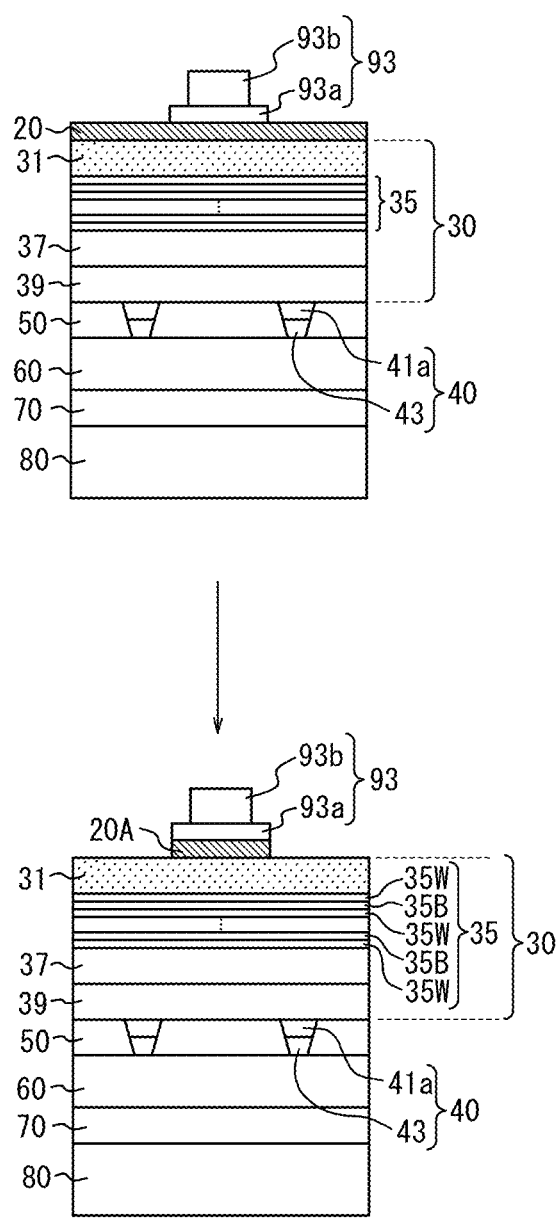
FIG. 9A is a schematic diagram illustrating a case where an n-type electrode is disposed on an n-type contact layer, and a portion of the n-type contact layer is then removed.
Figure 9B:
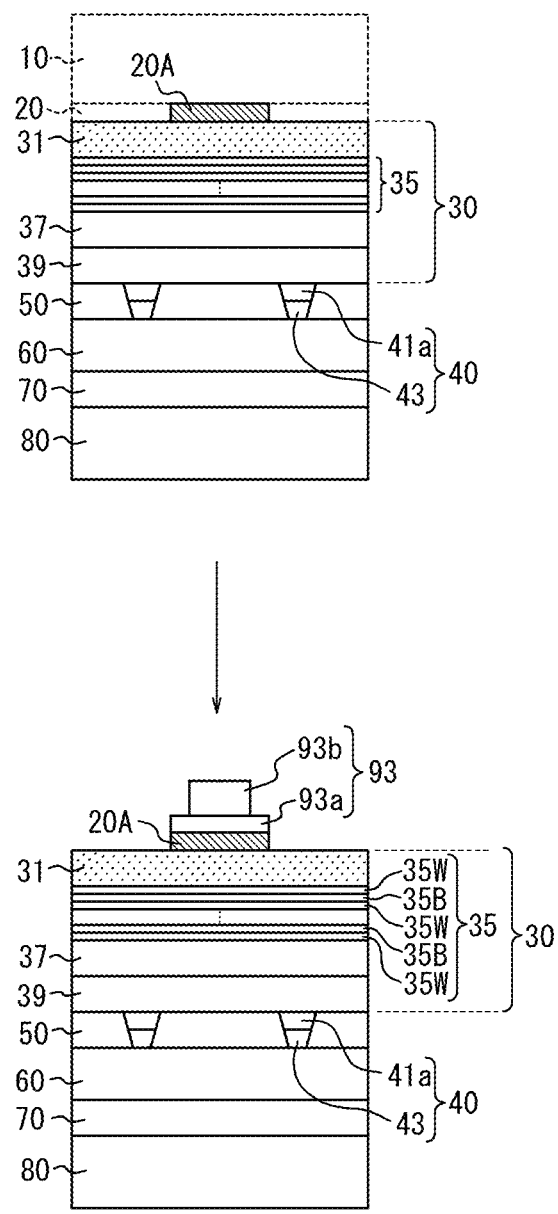
FIG. 9B is a schematic diagram illustrating a case where a portion of an n-type contact layer is removed, and an n-type electrode is then disposed on the remaining n-type contact layer.

Alternatively, in the present disclosure, as illustrated in FIGS. 9A and 9B, the n-type InGaAs contact layer 20 may be partially removed to provide the semiconductor laminate 30 with an exposed surface while an n-side electrode 93 is formed on an n-side electrode forming region 20A of the n-type InGaAs contact layer 20. After the n-side electrode 93 is provided on the n-side electrode forming region 20A, the n-type contact layer 20 may be partially removed (see FIG. 9A). Alternatively, the n-type contact layer 20 other than the n-side electrode forming region 20A may be removed beforehand, and then the n-side electrode 93 may be formed on the n-side electrode forming region 20A of the remaining n-type contact layer 20 (FIG. 9B). As described above, the n-type InGaAs contact layer 20 can be removed by wet etching in a sulfuric acid-hydrogen peroxide mixture, for example.

Upon forming the n-side electrode 93 on the n-side electrode forming region 20A of the n-type InGaAs contact layer 20, the n-side electrode 93 may include a wiring portion 93a and a pad portion 93b. Further, the n-side electrode 93, particularly the wiring portion 93a preferably contains Au and Ge, or preferably contains Ti, Pt, and Au. The n-side electrode 93 containing these metallic elements ensures an ohmic contact with the n-type InGaAs contact layer 20A. Further, after the wiring portion 93a is formed, a heat treatment is preferably carried out for establishing an ohmic contact between the contact layer and the electrode. It is also preferable that the pad portion 93b is formed after the heat treatment.

In the manner as described above, the semiconductor light-emitting element 100 can be fabricated. According to the method of manufacturing a semiconductor light-emitting element of this embodiment, the thickness of the support substrate in the semiconductor light-emitting element 100 manufactured can be sufficiently reduced as compared with manufacturing methods employing an InP substrate as a supporting substrate. Accordingly, the total thickness of the semiconductor light-emitting element 100 can be made small, thus the semiconductor light-emitting element 100 can be made small. Further, according to the method of manufacturing a semiconductor light-emitting element of this embodiment, since the reflective metal layer 60 is provided on the Si substrate side, light is emitted from the surface opposite to the support substrate. On the other hand, in a conventional method of manufacturing a semiconductor light-emitting element in which an InP substrate is used as a growth substrate and as a support substrate, light is emitted from both surface of the semiconductor laminate and side surfaces thereof. Accordingly, the method of manufacturing a semiconductor light-emitting element according to this embodiment is also advantageous in that the directivity of the emitted light is higher than that of conventional methods of manufacturing semiconductor light-emitting elements.

According to the method of manufacturing a semiconductor light-emitting element of this embodiment, because the thickness of the etch stop layer 20 is 100 nm or less, development of a cross-hatch caused by a lattice mismatch between the etch stop layer 20 and the InP growth substrate 10 can be prevented. Further, the etch stop layer 20 is also known to generate an As transition layer to the adjacent n-type InP cladding layer 31; yet, generation of such an As transition layer can also be prevented. From these perspectives, the thickness of the etch stop layer 20 is preferably 50 nm or less, and more preferably 20 nm or less, as described above. Note that the thickness of the etch stop layer 20 is preferably 1 nm or more for enabling the etch stop layer 20 to exhibit its intended function. Further, when the thickness of the etch stop layer 20 is 100 nm or less (preferably 50 nm or less, and more preferably 20 nm or less), an emission output power at 100 mA is also improved.

Further, according to the method of manufacturing a semiconductor light-emitting element of this embodiment, because the thickness of the p-type cladding layer 37 is 1200 nm to 9000 nm, the length along which currents diffuse in the semiconductor light-emitting element can also be increased, which increases the linearity of the light emission output power to an input current fed to the semiconductor light-emitting element. From this perspective, the thickness of the p-type cladding layer 37 is more preferably 2400 nm to 9000 nm, as described above.

Here, although not illustrated, the manufacturing method according to this embodiment preferably further includes a grinding step of grinding the conductive support substrate 80 to a thickness in a range of 80 μm or more and less than 200 μm. In this embodiment, since a Si substrate is used as the conductive support substrate 80, the conductive support substrate 80 would not be broken even if it is ground to a thickness of less than 200 μm. Further, the conductive support substrate 80 can be ground to a thickness of 150 μm or less, or may be ground to a thickness of 100 μm or less. Nevertheless, when the conductive support substrate 80 is ground to a thickness of less than 80 μm, even a Si substrate may be damaged. Therefore, the lower limit of the thickness is preferably set to 80 μm. Further, when the thickness of the conductive support substrate 80 is 80 μm or more, the semiconductor light-emitting element 100 is sufficiently handleable.

This grinding step may be performed prior to the above seventh step, may be performed between the seventh step and the eighth step, or may be performed after the eighth step. Preferably, the grinding step is performed after the eighth step. Use of a thinned wafer reduces the process step, which prevents the breakage of the wafer more reliably. When the grinding step is performed after the eighth step, the grinding step is performed before the formation of the back electrode to be described. Note that the grinding of the conductive support substrate 80 formed from a Si substrate may be performed by typical mechanical grinding, and etching may be performed in addition to the mechanical grinding.

Intermediate Article of Semiconductor Light-Emitting Element

Next, referring to a case where a semiconductor optical device is a semiconductor light-emitting element, an embodiment of an intermediate article of a semiconductor light-emitting element will be described.

As illustrated in FIGS. 1B, 1C, 2A, 2B, 2C, 3A, and 3B, an intermediate article of a semiconductor light-emitting element of this embodiment includes an InP growth substrate 10, an etch stop layer 20 formed on the InP growth substrate 10, and a semiconductor laminate 30 formed on the etch stop layer 20, wherein the semiconductor laminate 30 includes a plurality of a InGaAsP-based III-V group compound semiconductor layers containing at least In and P stacked one another. In the intermediate article of a semiconductor light-emitting element of this embodiment, the etch stop layer 20 has a thickness of 100 μm or less.

The InP-grown substrate 10, the etch stop layer 20, and the semiconductor laminate 30 are the same as the corresponding components described in the embodiment of the method of manufacturing a semiconductor light-emitting element, and hence the descriptions thereof will be omitted.

According to the intermediate article of a semiconductor light-emitting element of this embodiment, because the thickness of the etch stop layer 20 is 100 nm or less, development of a cross-hatch caused by a lattice mismatch between the etch stop layer 20 and the InP growth substrate 10 can be prevented. Further, similarly to the embodiment of the manufacturing method described above, when the layer adjacent to the etch stop layer 20 is an n-type InP cladding layer 31 in the semiconductor laminate 30, the etch stop layer 20 is also known to generate an As transition layer to the adjacent n-type InP cladding layer 31. According to the intermediate article of a semiconductor light-emitting element of this embodiment, generation of such an As transition layer can also be prevented. From these perspectives, in the intermediate article of a semiconductor light-emitting element of this embodiment, the thickness of the etch stop layer 20 is preferably 50 nm or less, and more preferably 20 nm or less. Note that the thickness of the etch stop layer 20 is preferably 1 nm or more for enabling the etch stop layer 20 to exhibit its intended function. The etch stop layer 20 may be a single layer, or may be a composite layer (e.g., an SLS layer) with another layer (in the latter case, the total thickness of the composite layer is 100 nm or less, preferably 50 nm or less, and more preferably 20 nm or less).

Here, in the intermediate article of a semiconductor light-emitting element of this embodiment, as illustrated in FIG. 1B, the semiconductor laminate 30 may be the outermost layer (the top layer opposite to the InP growth substrate 10). Alternatively, in the intermediate article of the semiconductor light-emitting element of this embodiment, as illustrated in FIG. 1C, a contact layer 41 may be formed on the semiconductor laminate 30, and the contact layer 41 may be the outermost layer. Further alternatively, in the intermediate article of a semiconductor light-emitting element of this embodiment, as illustrated in FIGS. 2A and 2B, an ohmic metal portion 43 is formed on the contact layer 41, and the ohmic metal portion 43 may be the outermost layer. Further alternatively, in the intermediate article of the semiconductor light-emitting element of this embodiment, as illustrated in FIG. 2C, a dielectric layer 50 may be formed on the semiconductor laminate 30, and the dielectric layer 50 and the ohmic metallic portion 43 may be the outermost layers. Further alternatively, in the intermediate article of the semiconductor light-emitting element of this embodiment, as illustrated in FIG. 3A, a reflective metal layer 60 may be formed on the dielectric layer 50 and the ohmic metal portion 43, and the reflective metal layer 60 may be the outermost layer. Further alternatively, in the intermediate article of the semiconductor light-emitting element of this embodiment, as illustrated in FIG. 3B, a metal bonding layer 70 and a conductive support substrate 80 are formed on the reflective metal layer 60, and the conductive support substrate 80 may be the outermost layer. These layers are the same as the corresponding layers described in the embodiment of the method of manufacturing a semiconductor light-emitting element, and hence descriptions thereof will be omitted.

In the intermediate article of a semiconductor light-emitting element of the present disclosure, the semiconductor laminate 30 includes an n-type cladding layer 31, an active layer 35, and a p-type cladding layer 37 in this order (from the etch stop layer 20 side in this embodiment), and the p-type cladding layer 37 preferably has a thickness of 1200 nm to 9000 nm. This is because the length along which currents diffuse in a semiconductor light-emitting element manufactured by using such an intermediate article of a semiconductor light-emitting element can be increased, which increases the linearity of the light emission output power to an input current fed to the semiconductor light-emitting element. From this perspective, in the intermediate article of a semiconductor light-emitting element of the present disclosure, the thickness of the p-type cladding layer 37 is more preferably 2400 nm to 9000 nm.

Semiconductor Light-Emitting Element

The semiconductor light-emitting element 100 of an embodiment of the present disclosure is a vertical semiconductor light-emitting element 100 which operates when electric current flows in a vertical direction. Specifically, as illustrated in FIG. 4B, this semiconductor light-emitting element 100 has a conductive support substrate 80; a metal bonding layer 70 provided on the surface of the conductive support substrate 80; a reflective metal layer 60 provided on the metal bonding layer 70; a semiconductor laminate 30 having a plurality of InGaAsP-based III-V compound semiconductor layers containing at least In and P stacked one another, provided on the reflective metal layer 60; and a dielectric layer 50 and a contact portion 40 which are provided in parallel between the reflective metal layer 60 and the semiconductor laminate 30. The main component of the reflective metal layer 60 is Au, and the conductive support substrate 80 is formed from a conductive Si substrate. As illustrated in FIG. 4B, the semiconductor light-emitting element 100 of this embodiment has a back electrode 91 and a top electrode 93.

As described above, this semiconductor light-emitting element 100 uses a conductive Si substrate as the conductive support substrate 80, so that the thickness of the support substrate can be made sufficiently small. Moreover, the semiconductor light-emitting element 100 is also advantageous in that the directivity of the emitted light is higher than that of conventional semiconductor light-emitting elements, since the reflective metal layer 60 is provided on the Si substrate side.

Further, in this embodiment, the thickness of the conductive support substrate 80 can be 80 μm or more and less than 200 μm, and the thickness can be 150 μm or less, or 100 μm or less.

Preferably, the semiconductor laminate 30 includes an n-type cladding layer 31, an active layer 35, and a p-type cladding layer 37 in this order, and the n-type cladding layer 31, the active layer 35, and the p-type cladding layer 37 are layers formed of an InGaAsP-based III-V compound semiconductor containing at least In and P. Also as described above, in the semiconductor laminate 30, the active layer 35 may have a double hetero structure which is sandwiched between the n-type cladding layer 31 and the p-type cladding layer 37, or a multiple quantum well structure, and the active layer 35 preferably has multiple quantum well structure. The dielectric layer is preferably formed of $SiO_2$.

Method of Manufacturing Semiconductor Light-Receiving Element

Next, referring to a case where a semiconductor optical device is a semiconductor light-receiving element, a method of manufacturing a semiconductor light-receiving element will be described.

For example, a semiconductor optical device can be utilized as a semiconductor light-receiving element by replacing the above-mentioned semiconductor laminate in the step of forming the semiconductor laminate in the method of manufacturing a semiconductor light-emitting element described above, with a semiconductor laminate including an InGaAs light absorption layer and an InP window layer. Since a semiconductor light-receiving element of this embodiment uses a Si substrate as a conductive support substrate, as in the semiconductor light-emitting element 100, the thickness of the conductive support substrate can be made small, and hence the total thickness of the semiconductor light-receiving element can be made small; thus, a small semiconductor light-receiving element can be obtained. Further, because the thickness of the etch stop layer 20 is 100 nm or less, development of a cross-hatch caused by a lattice mismatch between the etch stop layer 20 and the InP growth substrate 10 can be prevented. From this perspective, the thickness of the etch stop layer 20 is preferably 50 nm or less, and more preferably 20 nm or less, as described above. Note that the thickness of the etch stop layer 20 is preferably 1 nm or more for enabling the etch stop layer 20 to exhibit its intended function. The etch stop layer 20 may be a single layer, or may be a composite layer (e.g., an SLS layer) with another layer (in the latter case, the total thickness of the composite layer is 100 nm or less, preferably 50 nm or less, and more preferably 20 nm or less).

Intermediate Article of Semiconductor Light-Receiving Element

Next, referring to a case where a semiconductor optical device is a semiconductor light-receiving element, an intermediate article of a semiconductor light-receiving element will be described.

For example, the semiconductor optical device can be utilized as a semiconductor light-receiving element by replacing the above-mentioned semiconductor laminate in the intermediate article of a semiconductor light-emitting element described above, with a semiconductor laminate including an InGaAs light absorption layer and an InP window layer. Since a semiconductor light-receiving element of this embodiment uses a Si substrate as a conductive support substrate, as in the semiconductor light-emitting element 100, the thickness of the conductive support substrate can be made small, and hence the total thickness of the semiconductor light-receiving element can be made small; thus, a small semiconductor light-receiving element can be obtained. Further, since the thickness of the etch stop layer 20 is 100 nm or less, development of a cross-hatch caused by a lattice mismatch between the etch stop layer 20 and the InP growth substrate 10 can be prevented. From this perspective, the thickness of the etch stop layer 20 is preferably 50 nm or less, and more preferably 20 nm or less, as described above. Note that the thickness of the etch stop layer 20 is preferably 1 nm or more for enabling the etch stop layer 20 to exhibit its intended function. The etch stop layer 20 may be a single layer, or may be a composite layer (e.g., an SLS layer) with another layer (in the latter case, the total thickness of the composite layer is 100 nm or less, preferably 50 nm or less, and more preferably 20 nm or less).

Semiconductor Light-Receiving Element

A semiconductor light-receiving element according to an embodiment of the present disclosure includes a semiconductor laminate including an InGaAs light absorption layer and an InP window layer, in place of the semiconductor laminate in the intermediate article of a semiconductor light-emitting element described above, for example.

Although embodiments of this disclosure have been described, this disclosure is in no way limited to the above embodiments. For example, in the above-described embodiments, since an n-type InP substrate is used as the InP growth substrate 10 in these embodiments, the layers formed on the InP growth substrate 10 have n-type and p-type conductivity types as described above. Alternatively, a p-type InP growth substrate 10 may also be used in the present disclosure, and it can naturally be understood that those layers have n-type and p-type conductivity types in reverse order in such a case.

Further, when an undoped InP substrate is used as the InP growth substrate 10, the conductivity type of those layers may be determined to correspond to the conductivity (p-type or n-type) of the semiconductor layers formed on the InP growth substrate 10.

The present disclosure will be described in more detail below using examples. However, this disclosure is not limited to the following examples.

EXAMPLES

Example 1

A semiconductor light-emitting element of Example 1 was fabricated in accordance with the process steps illustrated in FIGS. 1A to 4B. The steps are as follows.

First, on the (100) plane of a 2-inch n-type InP substrate, an n-type $In_{0.57}Ga_{0.43}As$ etch stop layer (20 nm), an n-type InP cladding layer (thickness: 2 μm), an i-type InP spacer layer (thickness: 100 nm), an active layer having a quantum well structure with an emission wavelength of 1450 nm (180 nm in total), an i-type InP spacer layer (thickness: 320 nm), a p-type InP cladding layer (thickness: 2.4 μm), a p-type $In_{0.8}Ga_{0.20}As_{0.5}P_{0.5}$ cap layer (thickness: 50 nm), and a p-type $In_{0.57}Ga_{0.43}As$ contact layer (thickness: 50 nm), and a p-type $In_{0.57}Ga_{0.43}As$ contact layer (thickness: 100 nm) were sequentially formed by MOCVD. Note that in forming the active layer having a quantum well structure, ten $In_{0.73}Ga_{0.27}As_{0.5}P_{0.5}$ well layers (thickness: 10 nm) and ten InP barrier layers (thickness: 8 nm) were alternately stacked.

Figure 6A:
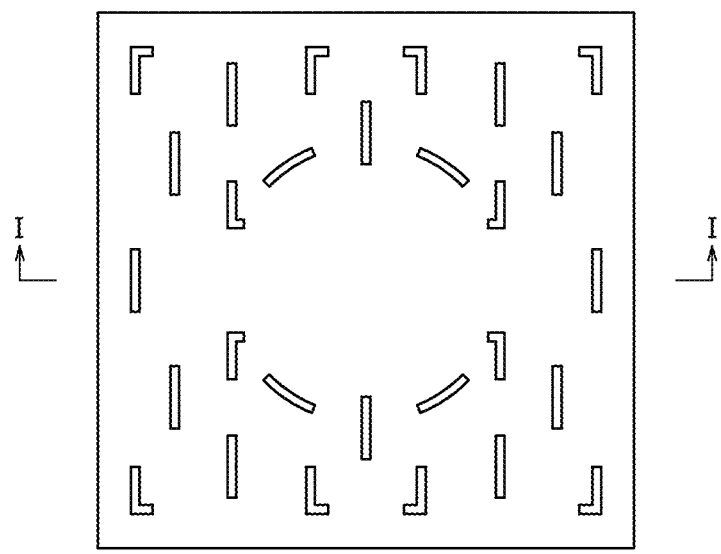
FIG. 6A is a schematic top view depicting a pattern of an ohmic electrode portion in Examples.

On the p-type $In_{0.57}Ga_{0.43}As$ contact layer, a p-type ohmic electrode portion (Au/AuZn/Au, total thickness: 530 nm) was formed into islands distributed as illustrated in FIG. 6A. The cross-sectional view of FIG. 6A taken along line I-I corresponds to the schematic cross-sectional view of FIG. 2A. When forming this pattern, a resist pattern was formed and an ohmic electrode was then vapor deposited, followed by lift-off of the resist pattern. When the semiconductor layer of the wafer in this state was observed in a top view using an optical microscope, the contact area ratio of the p-type ohmic electrode portion with respect to the semiconductor layer was 4.5%. Note that the outer size of the object depicted in FIG. 6A is 380 μm square.

Next, a resist mask was formed on and around the p-type ohmic electrode portion, and the p-type $In_{0.57}Ga_{0.43}As$ contact layer was removed, except for areas where the ohmic electrode portion was formed, by wet etching using a tartaric acid-hydrogen peroxide mixture. After that, a dielectric layer (thickness: 700 nm) made of $SiO_2$ was formed on the entire surface of the p-type $In_{0.80}Ga_{0.20}As_{0.50}P_{0.50}$ cap layer by plasma CVD. A window pattern having a shape extending over 3 μm each in the width direction and the longitudinal direction in an area above the p-type ohmic electrode portion was formed using a resist, and the dielectric layer on and around the p-type ohmic electrode portion was removed by wet etching using BHF to expose the p-type $In_{0.80}Ga_{0.20}As_{0.50}$ cap layer. At this time, the height $H_1$ (700 nm) of the dielectric layer on the p-type $In_{0.80}Ga_{0.20}As_{0.50}P_{0.50}$ cap layer is larger than the height $H_2$ (660 nm) of the contact portion composed of the p-type contact layer (thickness: 130 nm) and the p-type ohmic electrode portion (thickness: 530 nm) by 40 nm. When the semiconductor layer of the wafer in this state was observed in a top view using an optical microscope, the contact area ratio of the dielectric layer ($SiO_2$) was 90%.

Next, a reflective metal layer (Al/Au/Pt/Au) was formed on the entire surface of the p-type $In_{0.80}Ga_{0.20}As_{0.50}P_{0.50}$ cap layer by vapor deposition. The thickness of the metal layers in the reflective metal layer was 10 nm, 650 nm, 100 nm, and 900 nm in this order.

On the other hand, a metal bonding layer (Ti/Pt/Au) was formed on a conductive Si substrate (thickness: 300 μm) serving as a support substrate. The thickness of the metal layers in the metal bonding layer was 650 nm, 10 nm, and 900 nm in this order.

The reflective metal layer and the metal bonding layer were placed to face one another and were subjected to thermocompression bonding at 300° C. The InP substrate was then removed by wet etching with hydrochloric acid (concentration: 12%) to thereby expose the n-type $In_{0.57}Ga_{0.43}As$ etch stop layer.

Figure 6B:
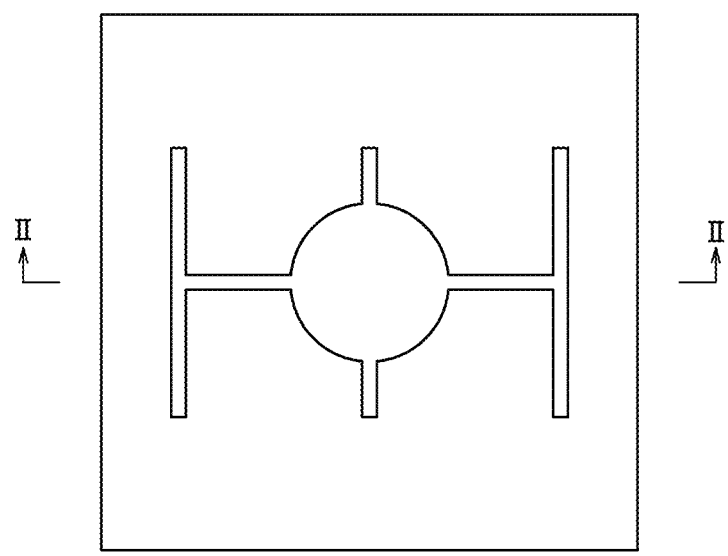
FIG. 6B is a schematic top view depicting a pattern of a top electrode in Examples.

Next, using a part of the n-type $In_{0.57}Ga_{0.43}As$ etch stop layer as an n-type contact layer, on the n-type $In_{0.57}Ga_{0.43}As$ contact layer, an n-type electrode (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1000 nm)) was formed as a wiring portion of a top electrode by resist pattern formation, vapor deposition of an n-type electrode, and lift-off of the resist pattern as illustrated in FIG. 6B. The portion where the n-type electrode was formed is referred to as the "n-type electrode forming region". Thereafter, an ohmic contact was established between the n-type InGaAs contact layer and the wiring portion of the n-side electrode by a heat treatment (an ohmic contact between the p-type InGaAs contact layer and the p-type ohmic electrode unit was also established at this timing). Further, a pad portion (Ti (thickness: 150 nm)/Pt (thickness: 100 nm)/Au (thickness: 2500 nm)) was formed on the n-type electrode to obtain a top electrode having a pattern as illustrated in FIG. 6B. The cross-sectional view of FIG. 6B taken along line II-II corresponds to FIG. 4B. Note that the outer size of the object depicted in FIG. 6B is 380 μm square as with FIG. 6A. Thereafter, the n-type $In_{0.57}Ga_{0.43}As$ etch stop layer 20 in the region other than the n-type electrode forming region (other than the n-type $In_{0.57}Ga_{0.43}As$ contact layer) was removed by wet etching with a sulfuric acid-hydrogen peroxide mixture.

Finally, the semiconductor layers between devices (width: 60 μm) were removed by mesa etching to form dicing lines. Then, after the Si substrate was thinned to a thickness of 87 μm by grinding, a back electrode (Ti (thickness: 10 nm)/Pt (thickness: 50 nm)/Au (thickness 200 nm)) was formed to the back surface of the Si substrate and chip singulation was performed by dicing, to thereby fabricate a semiconductor light-emitting element according to Example 1. The chip size was 350 μm×350 μm.

Example 2

Processing was carried out in the same manner as in Example 1 except that the thickness of the p-type cladding layer was made to be 7.2 μm.

Example 3

Processing was carried out in the same manner as in Example 1 except that the thickness of the etch stop layer was made to be 50 nm, and that the thickness of the p-type cladding layer was made to be 1.2 μm.

Example 4

Processing was carried out in the same manner as in Example 1 except that the thickness of the p-type cladding layer was made to be 1.2 μm.

Comparative Example 1

Processing was carried out in the same manner as in Example 1 except that the thickness of the etch stop layer was made to be 200 nm, and that the thickness of the p-type cladding layer was made to be 1.2 μm.

Comparative Example 2

Processing was carried out in the same manner as in Example 1 except that the thickness of the etch stop layer was made to be 200 nm, and that the thickness of the p-type cladding layer was made to be 1.8 μm.

Comparative Example 3

Processing was carried out in the same manner as in Example 1 except that the thickness of the etch stop layer was made to be 200 nm.

Evaluation 1: Evaluation of Light Emission Characteristics

For each of the semiconductor light-emitting elements according to Examples 1 to 4 and Comparative Examples 1 to 3, evaluations were made on a light output power Po by an integrating sphere when a 100-mA current was fed by a constant current voltage power supply, a forward voltage Vf when a 20-mA current was fed, and a peak emission wavelength λp. The measurements were carried out on the respective 10 samples (10 points at equal intervals from the center of the wafer to the outer periphery), and the results were averaged.

The results are summarized in Table 1.

Evaluation 2: Evaluation of Cross-Hatch

The appearance of the surface of the outermost layer (on the front side) of each of the semiconductor light-emitting element according to Examples 1 to 4 and Comparative Examples 1 to 3 was observed using a metallographic microscope and a wafer surface analyzing and visualizing system WASAVI series TRIOS33. No cross-hatch was observed in Examples 1 to 4, whereas cross-hatches were observed in Comparative Examples 1 to 3. The cross-hatches were not observed at and around the center of the wafer in Comparative Examples 1 to 3. The distance from the region where the cross-hatch was present from the wafer periphery, i.e., the OF (the orientation flat in the (0-1-1) plane orientation) or the IF (the sub flat in the (0-1-1) plane orientation), was measured.

Figure 7A:
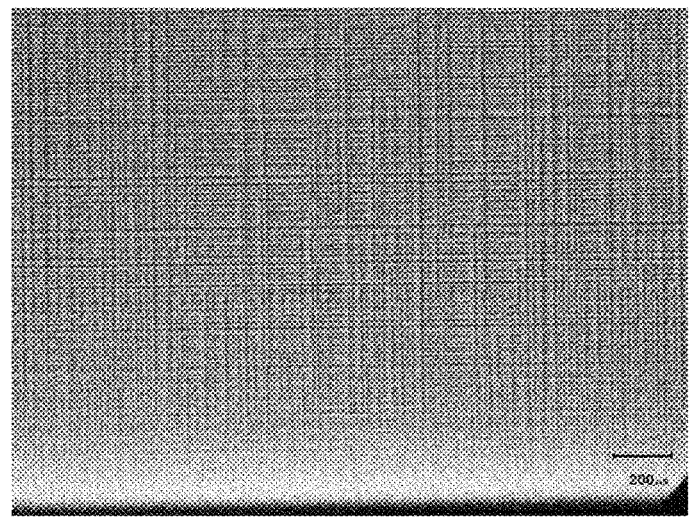
FIG. 7A is a diagram indicating a result of an evaluation of the appearance (metallurgical microscopic image) of Comparative Example 3.
Figure 7B:
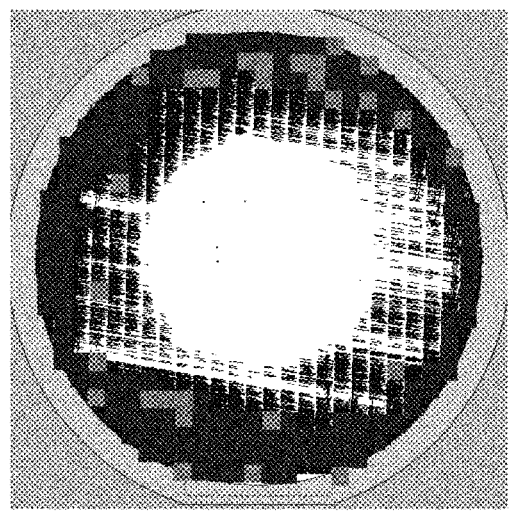
FIG. 7B is a diagram indicating a result of an evaluation of the appearance (by a WASAVI) of Comparative Example 3.
Figure 8A:
FIG. 8A is a diagram indicating a result of an evaluation of the appearance (metallurgical microscopic image) of Example 1.
Figure 8B:
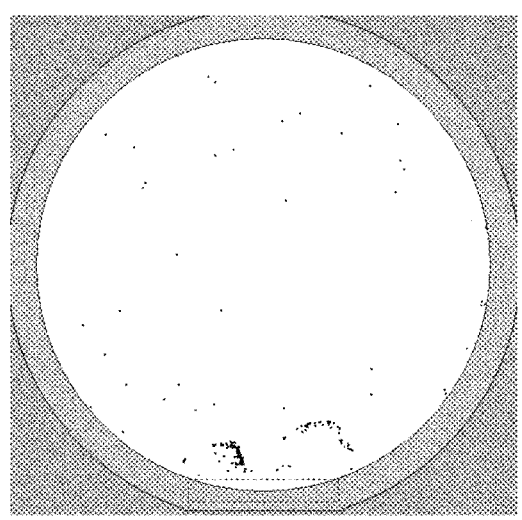
FIG. 8B is a diagram indicating a result of an evaluation of the appearance (by a WASAVI) of Example 1.

As examples, a metallurgical microscopic image in the vicinity of the orientation flat and an image of the wafer observed by TRIOS33 of Comparative Example 2 are depicted in FIG. 7A and FIG. 7B, respectively. A metallurgical microscopic image in the vicinity of the orientation flat and an image of the wafer observed by TRIOS33 of Example 1 are depicted in FIG. 8A and FIG. 8B, respectively. In addition, the results of Examples 1 to 4 and Comparative Examples 1 to 3 are summarized in Table 1. In Table 1, appearances when no cross-hatch was observed were scored as "Good", whereas appearances when a cross-hatch was observed were scored as "NG".

TABLE 1

|  | Compatative Example 1 | Compatative Example 2 | Compatative Example 3 | Example 1 | Example 2 | Example 3 | Example 4 |
| --- | --- | --- | --- | --- | --- | --- | --- |
| Thickness of etch stop layer (nm) | 200 | 200 | 200 | 20 | 20 | 50 | 20 |
| Thickness of p-type cladding layer (nm) | 1200 | 1800 | 2400 | 2400 | 7200 | 1200 | 1200 |
| Emission output (Po) (relative value to Compatative Example 1 as 1) (at 100 mA) | 1.00 | 1.15 | 1.23 | 1.46 | 1.50 | 1.02 | 1.05 |
| Emission peak wavelength λp (nm) (at 20 mA) | 1442.5 | 1435.0 | 1432.5 | 1415.5 | 1429.7 | 1441.7 | 1440.8 |
| Forward voltage Vf (V) (at 20 mA) | 0.962 | 0.960 | 0.940 | 0.911 | 0.888 | 0.960 | 0.956 |
| Appearance evaluation | NG | NG | NG | Good | Good | Good | Good |
| Hatch length OF (mm) | 11.6 | 14.8 | 11.3 | 0.0 | 0.0 | 0.0 | 0.0 |
| Hatch length IF (mm) | 11.7 | 15.2 | 11.9 | 0.0 | 0.0 | 0.0 | 0.0 |

As can be seen from Table 1 and FIGS. 7A, 7B, 8A, and 8B, no cross-hatch developed in Examples 1 to 4, whereas a cross-hatch developed on the outermost layer (on the front side) of each semiconductor light-emitting element in Comparative Examples 1 to 3. Further, as can be seen from Table 1, in Examples 1 and 2 in which the thickness of the p-type cladding layer was made to be 2400 nm or more, output powers when a high current of 100 mA was fed were higher than those in Examples 3 and 4 and Comparative Examples 1 and 2.

Further, when Example 1 is compared with Comparative Example 3, even when the thicknesses of the p-type cladding layers were the same, the output power when a high current of 100 mA was fed was higher in Example 1 where the etch stop layer was made thinner. Further, it can be seen that the forward voltages were lower in Examples 1 and 2 than those in Comparative Examples 1 to 3. Further, when Examples 3 and 4 and Comparative Example 1 which had the same thicknesses of the p-type cladding layer are compared, it can be seen that the forward voltages were lower in Examples 3 and 4 where the etch stop layer was made thinner.

REFERENCE SIGNS LIST

10 InP growth substrate
20 Etch stop layer
30 Semiconductor laminate
31 n-type cladding layer
35 Active layer
35W Well layer
35B Barrier layer
37 p-type cladding layer
39 p-type cap layer
40 Contact portion
41 (41a) p-type contact portion
43 Ohmic metal portion
50 Dielectric layer
60 Reflective metal layer
70 Metal bonding layer
80 Support substrate (conductive support substrate)
100 Semiconductor light-emitting element
91 Back electrode
93 Top electrode
E1 Exposed area
E2 Exposed surface
E3 Exposed portion

The invention claimed is:

1. A method of manufacturing a semiconductor optical device comprising the steps of:
    forming an etch stop layer on an InP growth substrate, the etch stop layer having a thickness of 5 nm or more and 50 nm or less; and
    forming a semiconductor laminate on the etch stop layer by stacking a plurality of InGaAsP-based III-V group compound semiconductor layers comprising at least In and P;
    bonding a support substrate to the semiconductor laminate having at least a metal bonding layer interposed therebetween; and
    removing the InP growth substrate,
    wherein the etch stop layer has a composition expressed by a formula $In_zGa(1-z)As$, where In composition ratio z is more than 0.532 and 0.60 or less,
    the semiconductor optical device is a semiconductor light-emitting element having an emission peak wavelength in a range of 1000 nm to 2200 nm, and emits light from the surface opposite to the support substrate,
    the semiconductor laminate comprises an n-type cladding layer, an active layer, and a p-type cladding layer, in this order, and
    the p-type cladding layer has a thickness of 2400 nm to 9000 nm.

2. The method of manufacturing a semiconductor optical device according to claim 1, wherein the thickness of the etch stop layer is 5 nm or more and 20 nm or less.

3. The method of manufacturing a semiconductor optical device according to claim 1, wherein a portion of the etch stop layer serves as an n-type InGaAs contact layer.

4. The method of manufacturing a semiconductor optical device according to claim 3, wherein the n-type InGaAs contact layer has a thickness of 1 nm to 50 nm.

5. The method of manufacturing a semiconductor optical device according to claim 1, wherein the In composition ratio z is 0.54 or more and 0.60 or less.

* * * * *